US007018855B2

(12) United States Patent
Kota et al.

(10) Patent No.: US 7,018,855 B2
(45) Date of Patent: Mar. 28, 2006

(54) PROCESS CONTROLS FOR IMPROVED WAFER UNIFORMITY USING INTEGRATED OR STANDALONE METROLOGY

(75) Inventors: Gowri P. Kota, Fremont, CA (US); Jorge Luque, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/746,969

(22) Filed: Dec. 24, 2003

(65) Prior Publication Data

US 2005/0148104 A1 Jul. 7, 2005

(51) Int. Cl.
*H01L 31/26* (2006.01)
*H01L 21/66* (2006.01)

(52) U.S. Cl. .......................... 438/14; 438/18; 438/907

(58) Field of Classification Search .................... 438/8, 438/10, 14, 17, 18, 907
See application file for complete search history.

(56) References Cited

U.S. PATENT DOCUMENTS 4,571,685 A 2/1986 Kamoshida
5,943,550 A 8/1999 Fulford, Jr. et al.
6,015,718 A * 1/2000 Rathbone ..................... 438/17
6,304,999 B1 10/2001 Toprac et al.
6,346,426 B1 * 2/2002 Toprac et al. .................. 438/8
6,783,904 B1 * 8/2004 Strozewski et al. ........... 430/30

(Continued)

FOREIGN PATENT DOCUMENTS

EP 0741406 A2 11/1996
WO WO 01/29873 A1 4/2001
WO WO 01/84382 A1 11/2001
WO WO 03/026001 A2 3/2003

OTHER PUBLICATIONS

Luque, J., et al., "Gate Width Optimization During Etch by Advanced Process Control Based on Optical Critical Dimension Measurement," Dry Etch Process Symposium, Nov. 2003, Tokyo, Japan.

(Continued)

*Primary Examiner*—Phuc T. Dang
(74) *Attorney, Agent, or Firm*—Carr & Ferrell LLP

(57) ABSTRACT

A method and apparatus is provided for measuring multiple locations on a wafer for controlling a subsequent semiconductor processing step to achieve greater dimensional uniformity across that wafer. The method and apparatus maps a dimension of a feature at multiple locations to create a dimension map, transforms the dimension map into a processing parameter map, and uses the processing parameter map to tailor the subsequent processing step to that specific wafer. The wafer can also be measured after the processing to compare an actual outcome with the targeted outcome, and the difference can be used to refine the transformation from a dimension map to a processing parameter map for a subsequent wafer.

34 Claims, 6 Drawing Sheets

U.S. PATENT DOCUMENTS

| | | | | |
|---|---|---|---|---|
| 6,862,491 | B1 * | 3/2005 | Levin et al. | 700/121 |
| 2003/0106642 | A1 | 6/2003 | Fairbairn et al. | |
| 2003/0165755 | A1 | 9/2003 | Mui et al. | |
| 2003/0180972 | A1 | 9/2003 | Al-Bayati et al. | |

OTHER PUBLICATIONS

Kota, G., et al., "Advanced Process Control for Polysilicon Gate Etching Using Integrated Optical CD Metrology," Microlithography SPIE 2003 Conference, Feb. 2003, Santa Clara, CA, USA.

Kota, G., et al., "Advanced Process Control Applied to 90-nm Lithography and Etch," Microlithography SPIE 2003 Conference, Feb. 2003, Santa Clara, CA, USA.

Luque, J., et al., "Critical Dimension and Remaining Film Thickness Within-Wafer Uniformity Improvement by Advanced Process Control Based on Optical Integrated Metrology," American Vacuum Society 50th International Symposium, Nov. 2003, Baltimore, MD, USA.

* cited by examiner

PROCESS CONTROLS FOR IMPROVED WAFER UNIFORMITY USING INTEGRATED OR STANDALONE METROLOGY

BACKGROUND OF THE INVENTION

1. Field of the Invention

The present invention relates generally to the field of semiconductor fabrication and more particularly to methods for utilizing metrology to improve dimensional uniformity during processing both across wafers and between wafers.

2. Description of the Prior Art

Semiconductor fabrication is commonly performed on substrates such as wafers of single-crystal silicon. Typically, numerous identical devices are fabricated on each wafer, and accordingly, one goal of semiconductor fabrication technology is to ensure uniformity between devices made at different locations on a wafer as well as uniformity between devices produced on different wafers. Ensuring such uniformity across and between wafers requires uniformity in processing so that, for example, layers have uniform and repeatable thicknesses and features have consistent dimensions. Unfortunately, deviations caused by non-uniform processing in one processing step can often become magnified through subsequent processing steps. Thus, if a deposited material layer varies in thickness across a wafer, a specific feature defined from that layer can have varying dimensions in different devices formed at different locations on that wafer.

Additionally, semiconductor processing is typically performed under high vacuum in very clean environments. In order to minimize contamination of wafers, multiple processing chambers are commonly clustered together with robotic means that are configured to shuttle wafers between the various chambers. In this way repetitive processes such as depositing layers, masking, etching, stripping, cleaning, and annealing can be performed on a wafer without exposing the wafer to the outside environment.

In order to control processing steps during semiconductor processing it is sometimes necessary to remove one or more test wafers from the processing cluster for either destructive or non-destructive measurement. One common destructive measurement technique is to cross-section a wafer to allow fabricated features to be observed in profile with a metrology tool such as a scanning electron microscope (SEM). This technique can provide highly accurate measurements of heights, widths, sidewall angles, radii of curvature, layer thicknesses, and so forth. This technique, however, destroys the wafer and is very time consuming and expensive to perform for each sample area being investigated. Another destructive technique employs focused ion-beam (FIB) milling to essentially define a low-angle trench into the wafer at a desired location. Like cross-sectioning, this technique allows features to be viewed in profile in a SEM, however, the profile is at a low angle and therefore certain measurements have to be corrected to account for the angle. While FIB allows more locations on a wafer to be investigated more rapidly, the wafer nevertheless is destroyed.

Several non-destructive techniques also exist. One such technique uses SEM to view features on a wafer from above, rather than in profile as with a cross-section. While this technique does not destroy the wafer, and can allow the wafer to be put back into the processing stream, it may increase wafer contamination, it can be time consuming to remove the wafer from the processing environment, and provides only limited measurements. Principally, this technique is used to measure lateral dimensions, such as line widths, but does not provide information about layer thicknesses, sidewall angles, and the like.

Another non-destructive technique involves ellipsometry which measures properties of light reflected at a low angle from a surface. Ellipsometry is well suited for measuring layer thicknesses of materials that are at least partially transparent to the selected wavelength of light, however, this technique measures a fairly large area compared to the dimensions of specific features produced in semiconductor fabrication. Thus, ellipsometry cannot be used to measure individual features on a wafer.

Because of the limitations of the available measurement techniques, semiconductor processing is commonly controlled by periodically measuring one or a few areas on selected wafers and applying those measurements to all subsequent wafers until another round of measurements is performed. As an example, the length of time of an etching step may depend on the thickness of a photoresist layer. To determine the correct etch time, the photoresist layer on a test wafer is measured in several locations and averaged. That average is then used to select the etch time for a number of subsequent wafers. It will be appreciated that variations from the average in the photoresist thickness across a wafer and between wafers can cause both over-etching and under-etching when a consistent etch time is used. It will be further appreciated that other processing steps can have similar dependencies such that applying a uniform processing condition based on a single measurement, or even an average of measurements, can produce inconsistent results across and between wafers.

Therefore, what is desired is a method for non-destructively measuring every wafer undergoing semiconductor processing to tailor subsequent processing steps to improve uniformity across and between wafers.

SUMMARY

The invention provides a method for controlling the processing of a wafer. The method includes determining a dimension map of a plurality of features on the wafer, determining a processing parameter map from the dimension map, and processing the wafer according to the processing parameter map. The dimension map can be determined by measuring the same dimension of each of the plurality of features, and can also be determined by determining the variation of a dimension of the plurality of features as a function of location on the wafer. The plurality of features can include a plurality of test patterns that can include a sufficient number of evenly spaced repeating features in a measurement area. In some embodiments the evenly spaced repeating features have the same dimension as a feature of interest, while in other embodiments the evenly spaced repeating features have a dimension with a known correlation to a dimension of a feature of interest.

According to the method for controlling the processing of a wafer, determining the dimension map can include measuring the plurality of features by spectroscopic ellipsometry or a reflectometer-based CD measurement technique, and can also include determining the variation of more than one dimension of the plurality of features as a function of location on the wafer. In those embodiments in which the wafer is processed in a processing chamber, the dimension map can be determined with a metrology tool that is integrated with the processing chamber or that stands alone from the processing chamber. Also according to the method, determining the processing parameter map from the dimension map can include applying a relationship to transform the dimension map into the processing parameter map. Determining the processing parameter map from the dimension map can also include applying a mapping algorithm. In some embodiments the processing parameter map establishes a temperature or a temperature range for a temperature tunable chuck or tunable gas injector.

The invention also provides a method for controlling wafer processing. This method includes determining a dimension map of a plurality of features on the wafer, determining a processing parameter map from the dimension map, processing the wafer according to the processing parameter map to create a post-processing feature on the wafer, determining a dimension of the post-processing feature, determining a figure of merit from the dimension of the post-processing feature, and determining a processing parameter for a subsequent wafer according to the figure of merit. Determining the dimension of the post-processing feature can include averaging measurements of more than one post-processing feature, and can also include determining a post-processing dimension map.

According to the method for controlling wafer processing, determining the figure of merit can include comparing the dimension of the post-processing feature to a targeted dimension for the post-processing feature. Determining the figure of merit can also include determining a difference between the dimension of the post-processing feature and a targeted dimension for the post-processing feature. In some embodiments determining the figure of merit can include determining a figure of merit map.

Also according to the method for controlling wafer processing, determining the processing parameter for the subsequent wafer can include determining a processing parameter map for the subsequent wafer. Further, determining the processing parameter for the subsequent wafer can include modifying a relationship between the processing parameter and a dimension of a feature on the subsequent wafer according to the figure of merit to produce a modified relationship. In some of these embodiments determining the processing parameter for the subsequent wafer can further include determining the dimension of the feature on the subsequent wafer and applying the modified relationship to the dimension of the feature. Also in some of these embodiments determining the processing parameter for the subsequent wafer can include determining a relationship map from a figure of merit map.

The invention also includes a wafer processing system. The wafer processing system includes means for determining a dimension map of a plurality of features on the wafer, means for determining a processing parameter map from the dimension map, and means for processing the wafer according to the processing parameter map. The means for determining the dimension map includes a metrology tool that can include a spectroscopic ellipsometer or can employ a reflectometer-based CD measurement technique. The means for processing the wafer can include a semiconductor processing system. In some of these embodiments the means for determining the dimension map includes a metrology tool integrated with the semiconductor processing system. Also in some of these embodiments the semiconductor processing system includes a processing chamber having a tunable element such as a temperature tunable chuck or a tunable gas injector.

Another wafer processing system of the invention includes means for determining a dimension map of a plurality of features on the wafer, means for determining a processing parameter map from the dimension map, means for processing the wafer according to the processing parameter map to create a post-processing feature on the wafer, means for determining a dimension of the post-processing feature, means for determining a figure of merit from the dimension of the post-processing feature, and means for determining a processing parameter for a subsequent wafer according to the figure of merit. In some of these embodiments the means for determining the dimension of the post-processing feature can include means for determining a post-processing dimension map. Also, the means for determining the figure of merit can include means for determining a figure of merit map. Additionally, the means for determining the processing parameter for the subsequent wafer can include means for determining a processing parameter map for the subsequent wafer.

DETAILED DESCRIPTION OF THE INVENTION

The invention provides a method and apparatus for using measurements from multiple locations on a wafer to control a subsequent semiconductor processing step to achieve greater dimensional uniformity across the wafer. By applying the method and apparatus to successive wafers, greater dimensional uniformity can also be achieved between wafers.

The method, as applied to an individual wafer, maps the wafer before a processing step and then tailors the processing step according to the map. More particularly, the method includes determining a dimension map of a plurality of features on the wafer, determining a processing parameter map from the dimension map, and processing the wafer according to the processing parameter map. As an example, a processing step is directed to etching a layer beneath a mask. The mask has a circular opening with a diameter dimension. The final diameter of the circular opening is a known function of the etch time and the wafer temperature. In this example the method first determines a dimension map of a plurality of features on the wafer, here a map of the diameters of openings at locations across the wafer. Next, based on the dimension map that shows how the opening diameters vary across the wafer with etch time and wafer temperature, the method determines a processing parameter map from the dimension map, and a single optimized etching time. In this example, the processing parameter map is a map of a processing parameter, wafer temperature, which can be applied to the wafer during the etching process. Thus, the processing parameter map shows the temperature that should be applied at different locations on the wafer. Lastly, the wafer is processed according to the processing parameter map, in this case the wafer is controllably etched such that the wafer temperature is varied across the wafer as specified by the processing parameter map. It will be appreciated that the given example is provided for illustrative purposes, and as described in more detail elsewhere herein, many types of features can be measured to determine a dimension map, and many processing parameters can be controlled to achieve greater dimensional uniformity.

The method, as applied to successive wafers, extends the method for individual wafers by creating a feed-back loop. After determining dimension and processing parameter maps and processing an initial wafer, a post-processing feature of the wafer is then measured. The method next compares the measurement of the post-processing feature to an expected value and feeds the difference back into the step of tailoring the processing step as applied to the next wafer. In the above example, where the final diameter of the circular opening is a function of wafer temperature and etch time, the feed-back loop allows the function to be fine tuned with each successive wafer that is processed.

Figure 1:
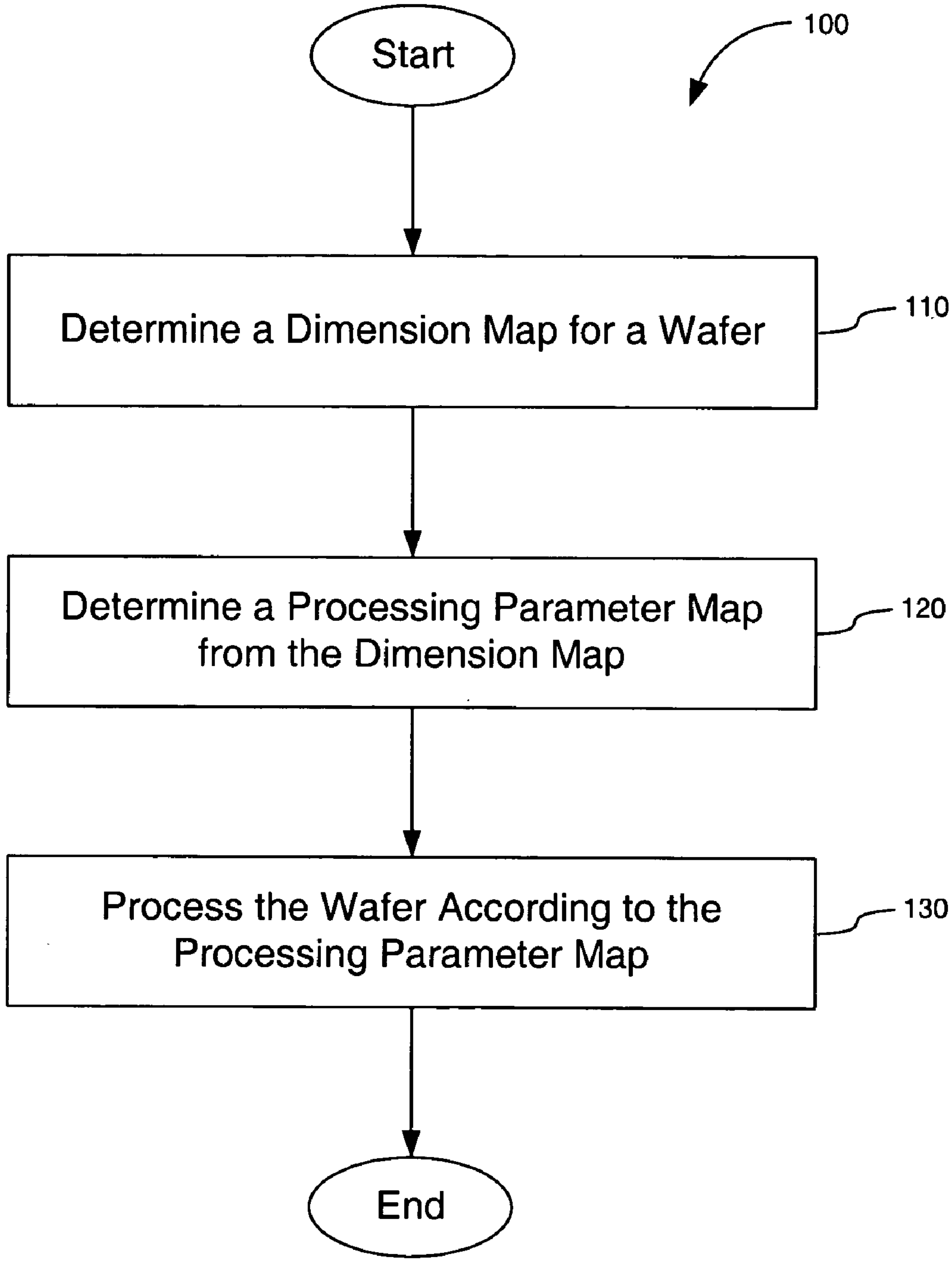
FIG. 1 is an exemplary method according to an embodiment of the invention.
Figure 2:
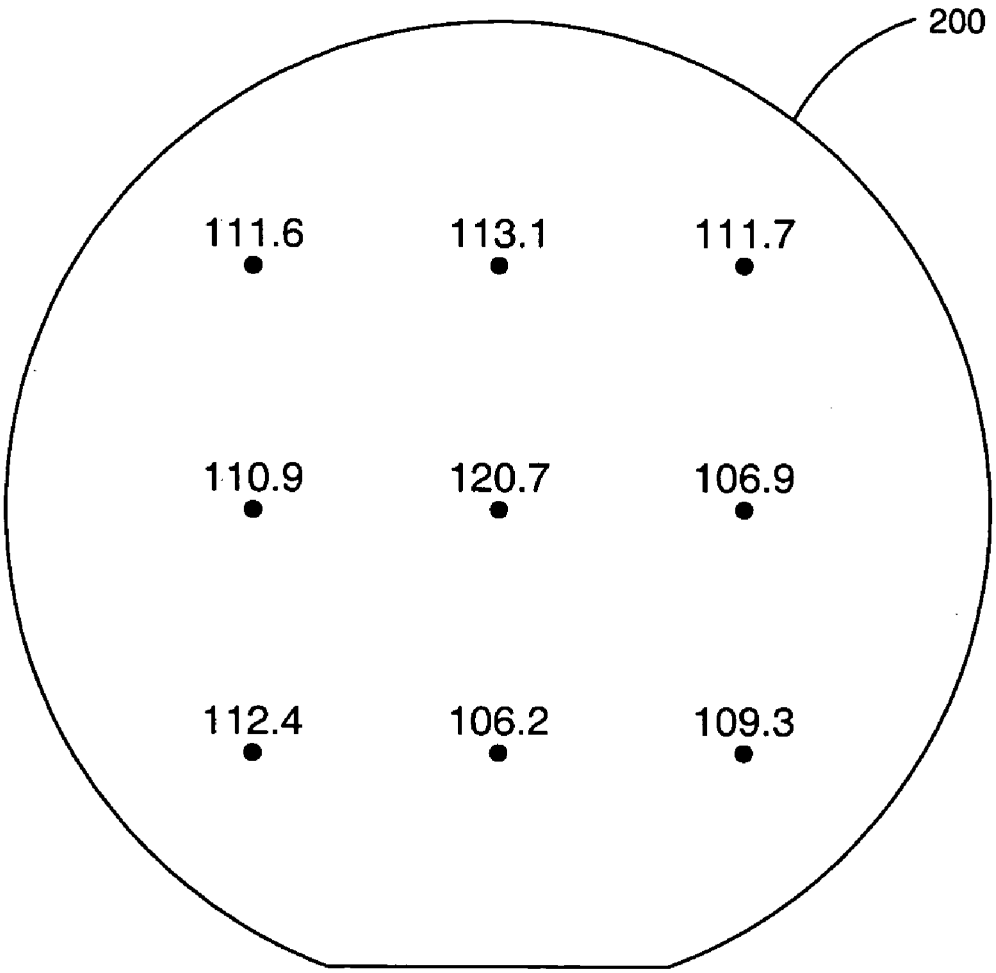
FIG. 2 is an exemplary dimension map produced according to an embodiment of the invention.

FIG. 1 illustrates an exemplary embodiment of a method 100 for achieving greater dimensional uniformity across a wafer. The method 100 includes a step 110 of determining a dimension map of a plurality of features on the wafer, a step 120 of determining a processing parameter map from the dimension map, and a step 130 of processing the wafer according to the processing parameter map. FIG. 2 shows an exemplary dimension map 200 that represents the variation of a dimension of a feature measured at a plurality of locations on a wafer. For example, the feature may be a line in a photoresist mask and the dimension is a width of the line. In the example of FIG. 2, the same line is measured in 9 locations in a square pattern to create a map of the variation in the line width, though it will be appreciated that dimension maps can consist of different patterns and more or fewer locations. In some embodiments the same feature in each device on the wafer is measured to form the dimension map.

A dimension map can be determined through the use of a non-destructive metrology tool that can provide rapid measurements of a common feature in multiple locations across a wafer. For example, if the feature is a film and the dimension to be mapped is the thickness of the film, an ellipsometer can be employed to generate a dimension map of film thickness across the wafer. As another example, if the feature is a photoresist line and the dimension to be mapped is the width of the line, an SEM can be used map the line width at multiple locations across the wafer. Reflectometer-based CD measurement techniques can also be employed as the metrology tool.

Another non-destructive measurement technique that can be used to create a dimension map is spectroscopic ellipsometry. An exemplary spectroscopic ellipsometry system is the iSpectraCD manufactured by KLA-Tencor (San Jose, Calif.). The iSpectraCD can be advantageously integrated with a clustered semiconductor processing system so that wafers can be measured without having to be removed from the processing system. It will be appreciated that the method of the invention is also operable where the metrology system is a standalone system.

Figure 3:
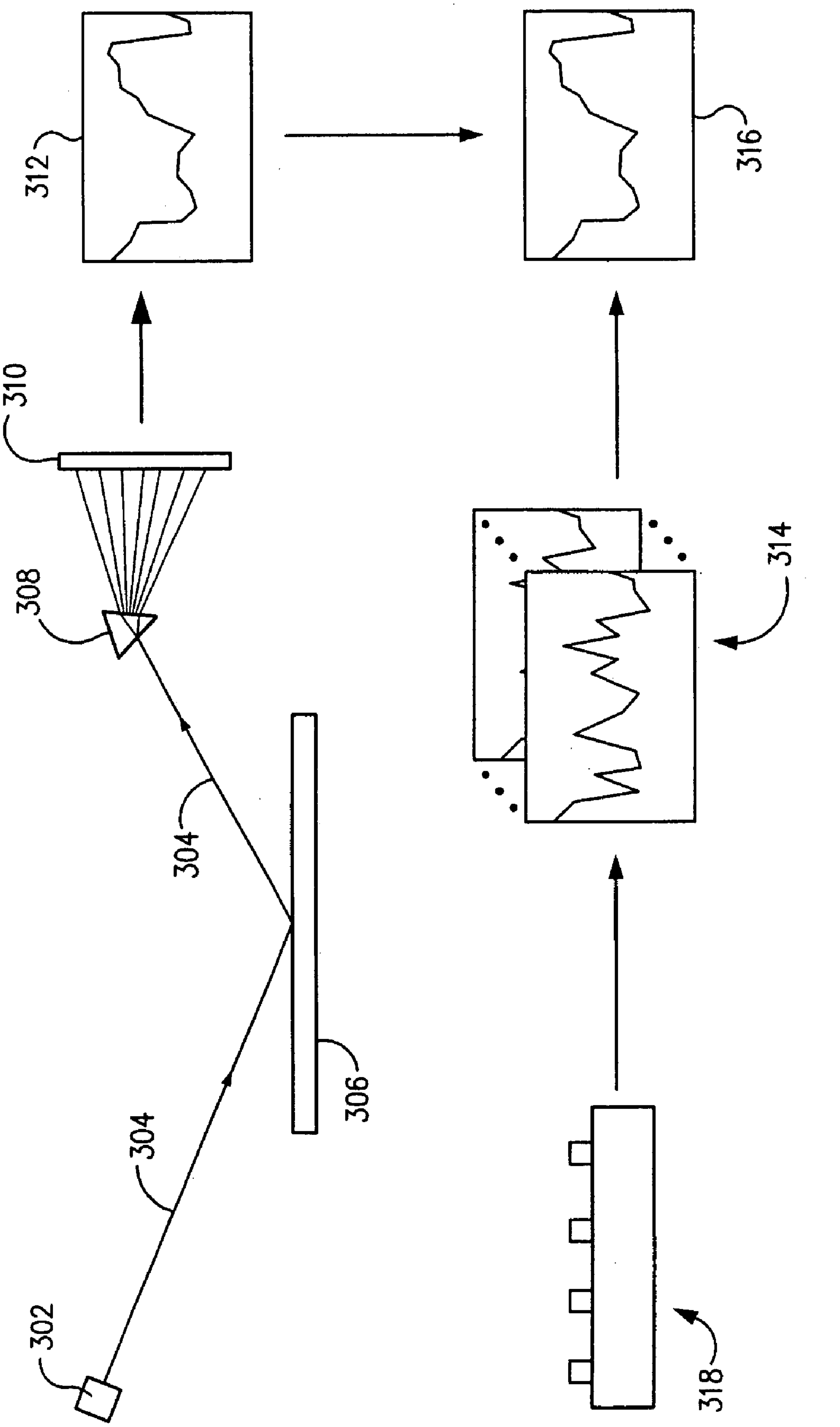
FIG. 3 is an illustration of an exemplary spectroscopic ellipsometry system.

FIG. 3 illustrates the use of spectroscopic ellipsometry. A broadband light source 302 directs a beam 304 of polarized light spanning a range of wavelengths, for example 240 nm to 780 nm, at a target wafer 306. The wafer 306 reflects the beam 304 towards a prism 308 that spreads the beam 304 and projects it onto a detector array 310. The detector array 310 analyzes the reflected beam 304 as a function of wavelength and polarization to produce a measured data spectrum 312. This spectrum 312 is then compared against a model data library 314 to determine a best fit 316.

Spectroscopic ellipsometry is an ellipsometric technique and is therefore best suited for measuring unpatterned layers and periodic arrays of features such as a grating on wafer 306. It will be appreciated that a periodic array of a feature can be measured in lieu of measuring a single occurrence of that feature, or a single occurrence of a related feature. To enable measurements of gratings, the library 314 is predetermined off-line for model gratings 318 with, for instance, different line spacings, layer materials and thicknesses, heights, widths, sidewall angles, degrees of corner roundings, etc. The dimensions of the model gratings 318 that are known when building the library 314 will establish the dimensions that will be simultaneously determinable by a measurement. Likewise, the number of different model gratings 318 and their variability will determine the accuracy and precision that will be obtainable by the measurement.

It will be appreciated that spectroscopic ellipsometry examines a measurement area that can be significantly larger than a feature of interest, for instance, in some embodiments the measurement area is 50 μm×50 μm. As noted elsewhere herein, a periodic array or pattern can be measured in place of a single occurrence of a feature. Ideally, the pattern is as large or larger than the measurement area of the spectroscopic ellipsometer. Suitable patterns of evenly spaced repeating features can sometimes be found, for example, in lines of photoresist in a mask layer. Where suitable patterns are not inherent to a particular device fabrication process, test patterns with sufficient numbers of evenly spaced repeating features can be added at known locations across a wafer. Ideally, the features in the test patterns are produced in the same manner and under the same conditions as the features of interest, so that the features in the test patterns will have the same dimensions as the features of interest. However, it is not essential to have the features of interest and the features of the test patterns be identical so long as a correlation is pre-determined so that a measurement on a test pattern can yield meaningful data about the features of interest.

Figure 4:
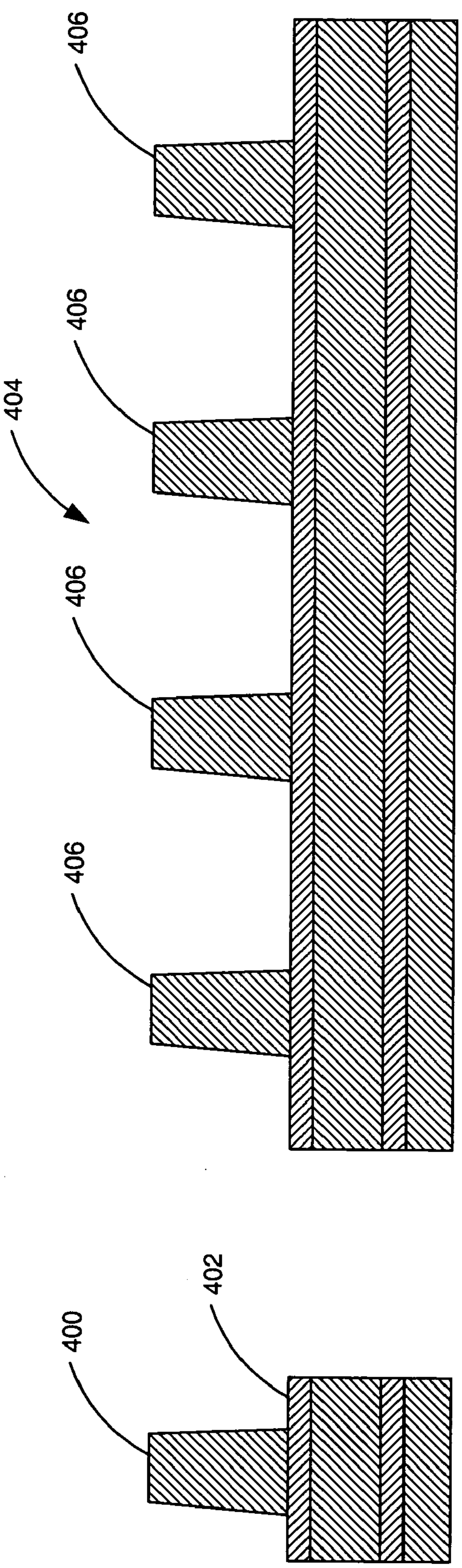
FIG. 4 is a cross-sectional view of an exemplary feature to be measured and of an exemplary test pattern of such features.

As an example, to create a dimension map by spectroscopic ellipsometry of a photoresist line 400 on a stack of layers 402, shown in cross-section in FIG. 4, a test pattern 404 with a series of evenly spaced photoresist lines 406 can be fabricated at different locations around the wafer. Ideally, photoresist lines 406 are identical to photoresist line 400. It will be appreciated that the spacing between photoresist lines 406 should be sufficient so that the photoresist lines 406 do not interfere with one another. In other words, if photoresist lines 406 are spaced too closely together they may not have the intended dimensions of the target photoresist line 400 and may instead have, for example, different sidewall angles and widths.

It is noted that spectroscopic ellipsometry is able to yield more than one dimension of a feature. Accordingly, spectroscopic ellipsometry measurements at locations across a wafer can yield dimension maps for as many dimensions as are measured. Further, more than one dimension can be incorporated into a single dimension map. For instance, a dimension map can be a map of a derived dimension that is the weighted average of two or more measured dimensions, or a difference between a measured dimension and a targeted dimension.

Referring again to FIG. 1, in step 120 a processing parameter map is determined from the dimension map. A processing parameter map is a representation of how one or more processing parameters will be applied to a wafer during a processing step. The most simple processing parameter map applies a uniform processing parameter to the entire wafer. For instance, a commonly controlled process parameter is the duration of the processing, and generally the duration is the same for the entire wafer. A processing parameter map for process duration where the duration is uniform across the entire wafer will be a single value, such as a number of seconds, and if represented in a form analogous to the dimension map 200 of FIG. 2 would show a wafer having a uniform value. Other process parameters for which a single value can apply include pressures, temperature, bias voltage, radio frequency (RF) power, gas flow rates, and gas flow ratios. A processing parameter map consisting of a single value can be determined from a dimension map, for example, by averaging values in the dimension map. Thus, an average dimension for the wafer is used to set the process parameter according to a known relationship or mathematical function that relates the measured dimension to the appropriate process parameter.

More complex processing parameter maps can also be determined. More complex processing parameter maps may conform to the physical limitations of the processing system. For example, wafer temperature can be made to vary across a wafer by the use of heaters. Heaters can direct heating onto a wafer from above or can be disposed in a wafer holder, or "chuck." A simple temperature tunable chuck can vary the temperature of a wafer radially such that the circumference of the wafer is either hotter or colder than the center. Other processing parameters such as bias voltage and ion flux can be similarly controlled across a wafer. Thus, a processing parameter map for wafer temperature, where the system is fitted with a temperature tunable chuck, can be a function over the range of the center to the circumference. The function can be linear or higher order.

Figure 5A:
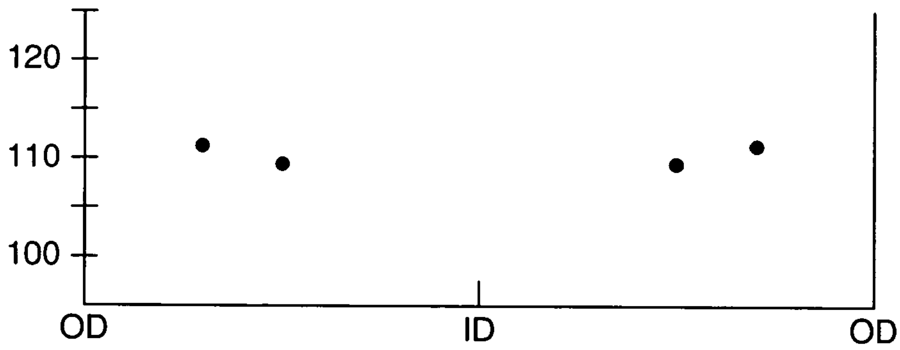
FIG. 5A is a graphical representation of the measurements shown in FIG. 4 as a function of radius.
Figure 5B:
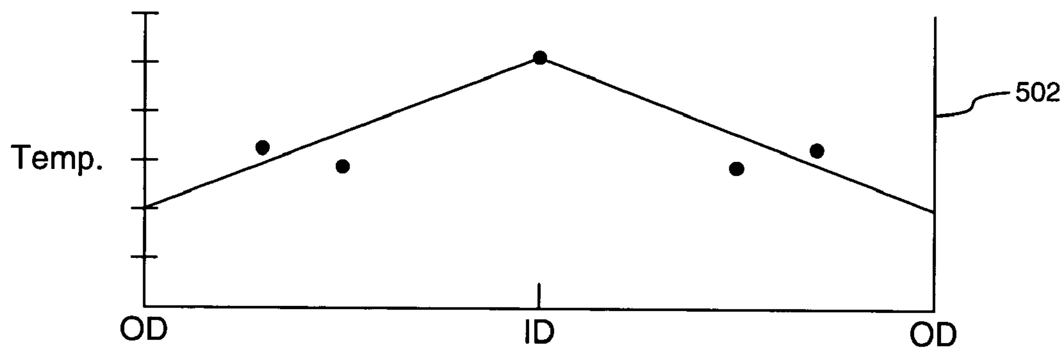
FIGS. 5B and 5C are exemplary processing parameter maps derived from the graphical representation of FIG. 5A.
Figure 5C:
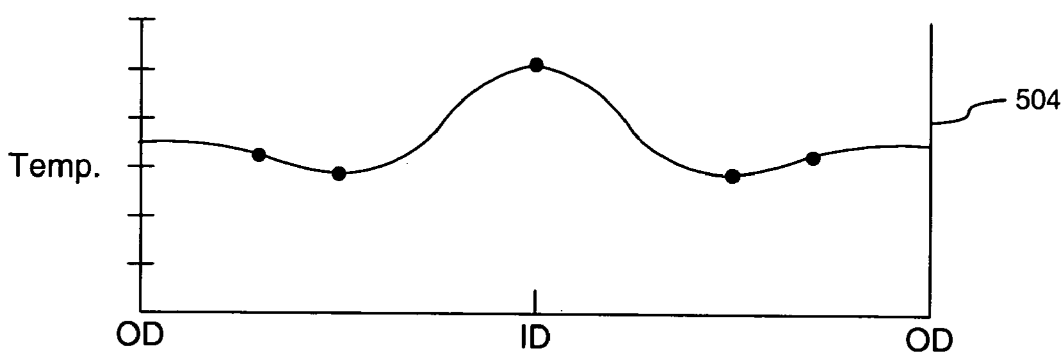

With reference to the exemplary dimension map 200 of FIG. 2 it will be appreciated that the measured line width shown is greatest in the center (ID) and smaller towards the circumference (OD). Since the 8 off-center points in the dimension map 200 reside at either of two specific radii, each group can be averaged to produce an average value for each radii, as shown in FIG. 5A. The two averaged values and the center (ID) value can be readily fitted with a line or higher order function to generate processing parameter maps 502 and 504 shown in FIGS. 5B and 5C, respectively. In the processing parameter maps 502 and 504 the exemplary processing parameter is temperature and there is a proportional relationship between the appropriate wafer temperature and the measured line width. It will be appreciated, however, that any relationship can be used to transform a dimension map to a processing parameter map.

Still more complex processing parameter maps can be created according to the complexity of the control scheme for the processing parameter. For example, a suitable processing parameter map for a temperature tunable chuck that controls wafer temperature with a square or hexagonal grid of embedded heating elements can have an independent temperature value for each heating element. Referring again to the exemplary dimension map 200 of FIG. 2, it will be appreciated that if the measurements that make up the dimension map 200 fall on a square grid, as shown, and the processing parameter map necessarily requires a hexagonal grid, then transforming the dimension map 200 to a suitable processing parameter map will require a more complex mapping algorithm. Such algorithms can be readily created by those of ordinary skill in the art. Suitable processing parameter maps for other tunable elements, such as a tunable gas injector that can spatially vary a gas flow rate, can be similarly created.

It will also be appreciated that more than one processing parameter map may be generated from a single dimension map. For instance, a dimension map can be used to create a processing parameter map for both temperature and bias voltage. Likewise, more than one dimension map can be used to determine one or more processing parameters through one or more processing parameter maps. For example, a dimension map of a feature's height and another dimension map of the feature's sidewall angle can be integrated together when determining a processing parameter map.

Referring once again to FIG. 1, in step 130 the wafer is processed according to the processing parameter map. The processing step 130 applied to the wafer can be, for example, a deposition, masking, etching, stripping, cleaning, or annealing process. At least one processing parameter of the processing step 130 is determined for the wafer by the processing parameter map that was generated in step 120. It will be appreciated that a processing parameter map can be applied to more than one semiconductor manufacturing process in step 130. For example, two successive etch processes on the same wafer can use the same processing parameter map to control wafer temperature. As noted elsewhere herein, more than one processing parameter map can be applied to the processing step 130 to simultaneously control more than one process parameter.

Figure 6:
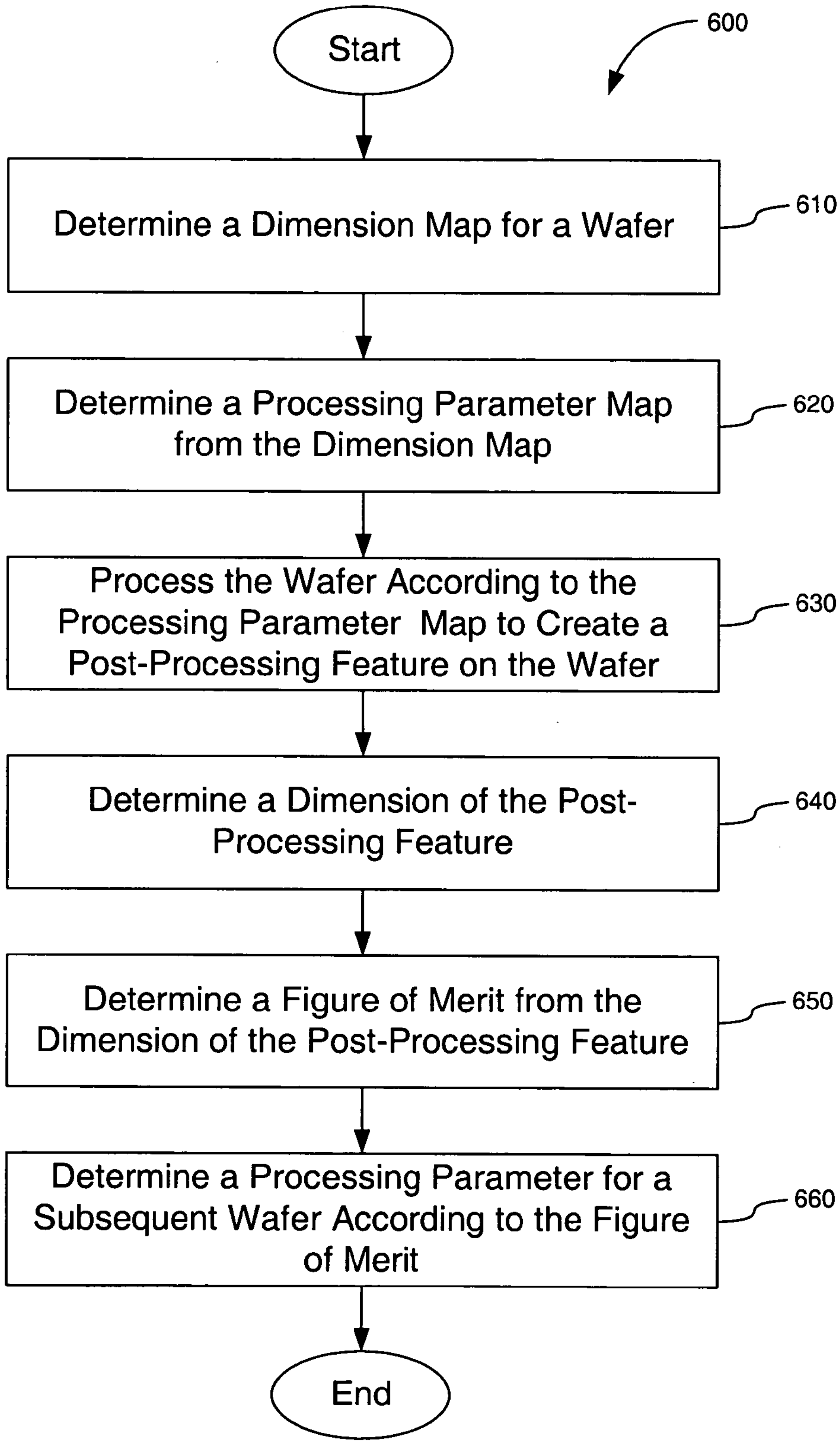
FIG. 6 is another exemplary method according to another embodiment of the invention.

FIG. 6 illustrates an exemplary embodiment of a method 600 for controlling wafer processing to achieve greater dimensional uniformity between successive wafers. The method 600 begins with a step 610 of determining a dimension map of a plurality of features on a wafer, a step 620 determining a processing parameter map from the dimension map, and a step 630 of processing the wafer according to the processing parameter map to create a post-processing feature on the wafer. Next, the method 600 has a step 640 of determining a dimension of the post-processing feature and a step 650 of determining a figure of merit from the dimension of the post-processing feature. Finally, the method 600 includes a step 660 of determining a processing parameter for a subsequent wafer according to the figure of merit.

Determining a dimension map of a plurality of features on a wafer in step 610 is essentially the same as the step 110 of method 100, and step 620 of determining a processing parameter map from the dimension map is essentially the same as the step 120 of method 100. Likewise, step 630 of processing the wafer according to the processing parameter map to create a post-processing feature on the wafer is much like step 130 of method 100, however, step 630 also requires the creation of a post-processing feature on the wafer. The post-processing feature can be, for example, a newly deposited layer, a line in a photoresist mask, or a feature produced by etching such as a transistor gate stack. In some embodiments the post-processing feature is a test pattern 404 that has been modified by the wafer processing in step 630. It will be appreciated that although only one post-processing feature need be created in order for the method 600 to proceed, more than one post-processing feature can be produced in step 630.

In step 640 a dimension of the post-processing feature is determined. The dimension of the post-processing feature can be determined with any suitable metrology system including the same metrology system that was used to create the dimension map in step 610. More than one post-processing feature on the wafer can be measured and averaged, or a post-processing dimension map can be created to show how the dimension of the post-processing feature varies across the wafer.

In step 650 a figure of merit is determined from the dimension of the post-processing feature. The figure of merit is based on a comparison between the measured dimension for the post-processing feature and some targeted dimension for that feature. For example, the figure of merit can be a ratio of the difference between the measured dimension and the target value, with positive values representing measured dimensions that are greater than the target and negative values representing measured dimensions that are less than the target. In those embodiments in which step 640 produces a post-processing dimension map, step 650 can likewise produce a map of the figure of merit to show how the figure of merit varies across the wafer.

In step 660 a processing parameter is determined for a subsequent wafer according to the figure of merit determined in step 650. As noted with respect to step 120 for determining a processing parameter map from a dimension map, the processing parameter map is determined according to some known relationship between the measured dimension and a processing parameter of the subsequent processing step. Where the relationship is linear, for example, the relationship can be expressed in the form $Y=mX+b$, where Y is the processing parameter and X is the measured dimension. Using such a linear relationship as an example, in step 660 the figure of merit can be used to modify either or both of the coefficient m and the offset b. A processing parameter can then be determined for a subsequent wafer by measuring the subsequent wafer and applying the known relationship having the modified coefficient.

It will be appreciated that after step 660, once a relationship between a dimension and a processing parameter has been modified according to a figure of merit determined in step 650, subsequent wafers can be processed without measuring the subsequent wafers. Instead, subsequent wafers can be assumed to be the same as the first wafer that was put through steps 610 through 650. In some of these embodiments, the dimension map determined for the first wafer in step 610 is assumed to apply to the subsequent wafers, and a processing parameter map is prepared for the subsequent wafers from that dimension map using the new relationship determined in step 660.

Alternatively, subsequent wafers can be measured at a single location such as the center even though an entire dimension map was prepared for the first wafer. In some of these embodiments the dimension map determined for the first wafer in step 610 is applied to each subsequent wafer, but scaled according to the single measurement. A processing parameter map for each subsequent wafer is then determined from the scaled dimension map and the new relationship determined in step 660. In still other embodiments, an independent dimension map is prepared for each subsequent wafer as per step 110 of method 100. Each such dimension map is transformed into a processing parameter map according to the new relationship determined in step 660.

In some embodiments the relationship between dimension and processing parameter can be made a function of location on the wafer. In these embodiments multiple post-processing features on the wafer are measured. For each such post-processing feature a figure of merit is determined to create a figure of merit map that can be developed into a relationship map. Thereafter, a dimension map for a subsequent wafer can be transformed into a processing parameter map according to the relationship map. In such a system the figure of merit map represents how closely the post-processing features were to the targeted value as a function of position on the wafer. The relationship map represents how the relationship between measured dimension and processing parameter should vary as a function of location to achieve the greatest uniformity across the next wafer. In some embodiments every wafer progresses through method 600 so that each wafer benefits from the prior wafer.

It will also be appreciated that in some embodiments the method can begin at step 640. In these embodiments the initial wafer is processed to create a post-processing feature and then in step 640 a dimension of the post-processing feature is determined. Thereafter, in step 650 a figure of merit is determined from the dimension of the post-processing feature, and then in step 660 a processing parameter is determined for a subsequent wafer according to the figure of merit determined in step 650. This method can then be repeated for subsequent wafers.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A method for controlling processing of a wafer comprising:

determining a dimension map of a plurality of features on the wafer, the plurality of features including a plurality of test patterns, the test patterns including a sufficient number of evenly spaced repeating features in a measurement area, the evenly spaced repeating features having a dimension with a known correlation to a dimension of a feature of interest;

determining a processing parameter map from the dimension map; and processing the wafer according to the processing parameter map.

2. The method of claim 1 wherein determining the dimension map includes measuring the same dimension of each of the plurality of features.

3. The method of claim 1 wherein determining the dimension map includes determining the variation of a dimension of the plurality of features as a function of location on the wafer.

4. The method of claim 1 wherein the evenly spaced repeating features have a same dimension as a feature of interest.

5. The method of claim 1 wherein determining the dimension map includes determining the variation of more than one dimension of the plurality of features as a function of location on the wafer.

6. The method of claim 1 wherein determining the processing parameter map from the dimension map includes applying a relationship to transform the dimension map into the processing parameter map.

7. The method of claim 1 wherein determining the processing parameter map from the dimension map includes applying a mapping algorithm.

8. A method for controlling processing of a wafer comprising:

determining a dimension map of a plurality of features on the wafer including measuring the plurality of features by spectroscopic ellipsometry;

determining a processing parameter map from the dimension map; and processing the wafer according to the processing parameter map.

9. A method for controlling processing of a wafer comprising:

determining a dimension map of a plurality of features on the wafer including measuring the plurality of features with a reflectometer-based CD measurement technique;

determining a processing parameter map from the dimension map; and processing the wafer according to the processing parameter map.

10. A method for controlling processing of a wafer comprising:

determining, with a metrology tool that is integrated with a processing chamber, a dimension map of a plurality of features on the wafer;

determining a processing parameter map from the dimension map; and processing the wafer in the processing chamber according to the processing parameter map.

11. A method for controlling processing of a wafer comprising:

determining, with a metrology tool that stands alone from a processing chamber, a dimension map of a plurality of features on the wafer;

determining a processing parameter map from the dimension map; and processing the wafer in the processing chamber according to the processing parameter map.

12. A method for controlling processing of a wafer comprising:

determining a dimension map of a plurality of features on the wafer;

determining a processing parameter map from the dimension map, the processing parameter map establishing a temperature for a temperature tunable chuck; and processing the wafer according to the processing parameter map.

13. A method for controlling processing of a wafer comprising:

determining a dimension map of a plurality of features on the wafer;

determining a processing parameter map from the dimension map, the processing parameter map establishing a temperature range for a temperature tunable chuck; and processing the wafer according to the processing parameter map.

14. A method for controlling wafer processing comprising:

determining a dimension map of a plurality of features on the wafer;

determining a processing parameter map from the dimension map;

processing the wafer according to the processing parameter map to create a post-processing feature on the wafer;

determining a dimension of the post-processing feature;

determining a figure of merit from the dimension of the post-processing feature; and determining a processing parameter for a subsequent wafer according to the figure of merit.

15. The method of claim 14 wherein determining the dimension of the post-processing feature includes averaging measurements of more than one post-processing feature.

16. The method of claim 14 wherein determining the dimension of the post-processing feature includes determining a post-processing dimension map.

17. The method of claim 14 wherein determining the figure of merit includes comparing the dimension of the post-processing feature to a targeted dimension for the post-processing feature.

18. The method of claim 14 wherein determining the figure of merit includes determining a difference between the dimension of the post-processing feature and a targeted dimension for the post-processing feature.

19. The method of claim 14 wherein determining the figure of merit includes determining a figure of merit map.

20. The method of claim 14 wherein determining the processing parameter for the subsequent wafer includes modifying a relationship between the processing parameter and a dimension of a feature on the subsequent wafer according to the figure of merit to produce a modified relationship.

21. The method of claim 20 wherein determining the processing parameter for the subsequent wafer further includes determining the dimension of the feature on the subsequent wafer and applying the modified relationship to the dimension of the feature.

22. The method of claim 20 wherein determining the processing parameter for the subsequent wafer includes determining a relationship map from a figure of merit map.

23. The method of claim 14 wherein determining the processing parameter for the subsequent wafer includes determining a processing parameter map for the subsequent wafer.

24. A wafer processing system comprising:

means for determining a dimension map of a plurality of features on the wafer, the means including a metrology tool;

means for determining a processing parameter map from the dimension map; and means for processing the wafer according to the processing parameter map.

25. The wafer processing system of claim 24 wherein the metrology tool includes a spectroscopic ellipsometer.

26. The wafer processing system of claim 24 wherein the metrology tool employs a reflectometer-based CD measurement technique.

27. A wafer processing system comprising:

means for determining a dimension map of a plurality of features on the wafer;

means for determining a processing parameter map from the dimension map; and means for processing the wafer according to the processing parameter map, the means including a semiconductor processing system.

28. The wafer processing system of claim 27 wherein the means for determining the dimension map includes a metrology tool integrated with the semiconductor processing system.

29. The wafer processing system of claim 27 wherein the semiconductor processing system includes a processing chamber having a temperature tunable chuck.

30. The wafer processing system of claim 27 wherein the semiconductor processing system includes a processing chamber having a tunable gas injector.

31. A wafer processing system comprising:

means for determining a dimension map of a plurality of features on the wafer;

means for determining a processing parameter map from the dimension map;

means for processing the wafer according to the processing parameter map to create a post-processing feature on the wafer;

means for determining a dimension of the post-processing feature;

means for determining a figure of merit from the dimension of the post-processing feature; and means for determining a processing parameter for a subsequent wafer according to the figure of merit.

32. The wafer processing system of claim 31 wherein the means for determining the dimension of the post-processing feature includes means for determining a post-processing dimension map.

33. The wafer processing system of claim 31 wherein the means for determining the figure of merit includes means for determining a figure of merit map.

34. The wafer processing system of claim 31 wherein the means for determining the processing parameter for the subsequent wafer includes means for determining a processing parameter map for the subsequent wafer.

* * * * *